(12) United States Patent
Bai et al.

(10) Patent No.: US 11,789,499 B2
(45) Date of Patent: Oct. 17, 2023

(54) SYSTEMS AND METHODS FOR AUTOMATICALLY OPENING HINGED COMPONENTS OF ELECTRONIC DEVICES

(71) Applicant: Intel Corporation, Santa Clara, CA (US)

(72) Inventors: Chunlin Bai, Shenzhen (CN); Binglin Xu, Shenzhen (CN); Guangrui Liang, Shenzhen (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/057,038

(22) PCT Filed: Dec. 18, 2018

(86) PCT No.: PCT/CN2018/121681
§ 371 (c)(1),
(2) Date: Nov. 19, 2020

(87) PCT Pub. No.: WO2020/124345
PCT Pub. Date: Jun. 25, 2020

(65) Prior Publication Data
US 2021/0311523 A1 Oct. 7, 2021

(51) Int. Cl.
*G06F 1/16* (2006.01)
*H05K 5/02* (2006.01)
(52) U.S. Cl.
CPC ............ *G06F 1/166* (2013.01); *G06F 1/1675* (2013.01); *H05K 5/0226* (2013.01)
(58) Field of Classification Search
CPC ...... G06F 1/1675; G06F 1/166; H05K 5/0226
See application file for complete search history.

(56) References Cited

U.S. PATENT DOCUMENTS

| 7,257,431 B2 * | 8/2007 | Chen ...................... G06F 1/1679 16/342 |
| 8,215,684 B2 * | 7/2012 | Whitens .................. E05C 19/16 292/DIG. 65 |

(Continued)

OTHER PUBLICATIONS

Notification of Transmittal of the International Search Report and the Written Opinion of the International Searching Authority,or the Declaration, dated Sep. 17, 2019 for International application No. PCT/CN2018/121681.

(Continued)

*Primary Examiner* — Rockshana D Chowdhury
*Assistant Examiner* — Douglas R Burtner
(74) *Attorney, Agent, or Firm* — Fletcher Yoder, P.C.

(57) ABSTRACT

The present disclosure is directed at automatically opening hinged components of computing devices. One of the computing device and a hinged component may include an electrical winding or coil while the other may include a magnet. When current is applied to the electrical winding (e.g., in a direction opposite of the North/South direction of the magnets' magnetic field), the electrical winding may generate a magnetic field opposite that repels the magnet's magnetic field. The magnetic repulsion may cause the hinged component to separate from the rest of the computing device, thereby opening the hinged component. When the current is removed from the electrical winding, the electrical winding may no longer generate a magnetic field, enabling the hinged component to be closed.

22 Claims, 8 Drawing Sheets

(56) References Cited

U.S. PATENT DOCUMENTS

| | | | |
|---|---|---|---|
| 8,705,229 B2* | 4/2014 | Ashcraft | G06F 1/1679 |
| | | | 312/223.1 |
| 9,001,526 B2* | 4/2015 | Sip | G06F 1/1615 |
| | | | 361/728 |
| 9,723,735 B1* | 8/2017 | Kim | F16M 11/041 |
| 9,822,567 B1* | 11/2017 | Lin | G06F 1/1681 |
| 10,185,354 B2* | 1/2019 | McBroom | G06F 1/1616 |
| 10,324,499 B1* | 6/2019 | Kaya | E05B 47/0006 |
| 10,503,216 B2* | 12/2019 | Weldon | G06F 1/1681 |
| 11,353,934 B2* | 6/2022 | Mehandjiysky | G06F 1/1681 |
| 2005/0036283 A1* | 2/2005 | Hillman | F16M 11/14 |
| | | | 248/278.1 |
| 2006/0256075 A1 | 11/2006 | Anastas et al. | |
| 2006/0288533 A1* | 12/2006 | Lee | G03G 21/1628 |
| | | | 16/330 |
| 2007/0133156 A1* | 6/2007 | Ligtenberg | G06F 1/1616 |
| | | | 361/679.3 |
| 2008/0146295 A1* | 6/2008 | Jorgensen | H01F 7/04 |
| | | | 455/575.3 |
| 2013/0286623 A1* | 10/2013 | Slipy | H04M 1/0202 |
| | | | 361/807 |
| 2013/0329351 A1* | 12/2013 | Lin | G06F 1/1618 |
| | | | 312/323 |
| 2014/0070686 A1* | 3/2014 | Sip | G06F 1/1679 |
| | | | 312/327 |
| 2014/0071648 A1* | 3/2014 | Sip | G06F 1/1615 |
| | | | 361/809 |
| 2015/0027774 A1* | 1/2015 | Kang | H05K 5/0004 |
| | | | 174/535 |
| 2016/0051067 A1* | 2/2016 | Law | F16M 11/2021 |
| | | | 361/679.22 |
| 2016/0217953 A1 | 7/2016 | Ely et al. | |
| 2017/0003719 A1* | 1/2017 | Siddiqui | G06F 1/166 |
| 2017/0017273 A1* | 1/2017 | Weldon | G06F 1/1681 |
| 2017/0040932 A1* | 2/2017 | Lillywhite | H02S 20/30 |
| 2017/0076885 A1 | 3/2017 | Stryker | |
| 2017/0150792 A1* | 6/2017 | Kim | A45C 13/002 |
| 2018/0053588 A1 | 2/2018 | Barel | |
| 2019/0107245 A1* | 4/2019 | Torres | G06F 1/166 |
| 2020/0013531 A1* | 1/2020 | Tazbaz | E05B 65/0067 |
| 2020/0019215 A1* | 1/2020 | Wang | G06F 1/1618 |
| 2021/0405702 A1* | 12/2021 | Hudgins | G06F 1/1622 |

OTHER PUBLICATIONS

Notification of Transmittal of the International Examination Report , dated Aug. 17, 2022 for International application No. 202047053394.

\* cited by examiner

SYSTEMS AND METHODS FOR AUTOMATICALLY OPENING HINGED COMPONENTS OF ELECTRONIC DEVICES

CROSS REFERENCE TO RELATED APPLICATION

This application is a U.S. national stage filing of PCT Application Serial No. PCT/CN2018/121681, filed Dec. 18, 2018, and entitled "Systems and Methods for Automatically Opening Hinged Components of Electronic Devices," which is incorporated by reference herein in its entirety for all purposes.

BACKGROUND

This disclosure relates generally to opening hinged components of electronic devices, such as kickstands of tablets or display portions of laptops.

This section is intended to introduce the reader to various aspects of art that may be related to aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Certain electronic devices, such as tablets, laptops, smartphones, phablets, and the like, may include hinged components. For example, a tablet may include a kickstand that, when opened, may be used to position the tablet in a standing or near-vertical position without requiring a user to hold the tablet. Similarly, a laptop may include a display and keyboard that are coupled together via a hinge. A user may open the laptop via the hinge such that the display is in a standing or near-vertical position without requiring the user hold the display upright.

However, to open a hinged component, a user often manually extends the hinged component to an open position from a closed position. In some cases, the user may first manually unlock the hinged component (e.g., by engaging an unlocking mechanism of the electronic device). Some users may find these manual processes to be frustrating or overly time-consuming.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure describes systems and methods for automatically opening hinged components of electronic devices. The electronic devices may include tablets, laptops, smartphones, phablets, and the like, and the hinged components may include kickstands or display portions of the electronic devices. One of the electronic device and the hinged component may include an electrical winding or coil while the other may include a magnet (e.g., a permanent magnet). When current is applied to the electrical winding (e.g., in a direction opposite of the North/South direction of the magnets' magnetic field), the electrical winding may generate a magnetic field that repels the magnet's magnetic field. The magnetic repulsion may cause the hinged component to separate from the rest of the electronic device, thereby opening the hinged component.

When the current is removed from the electrical winding, the electrical winding may no longer generate a magnetic field, enabling the hinged component to be closed.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Figure 1:
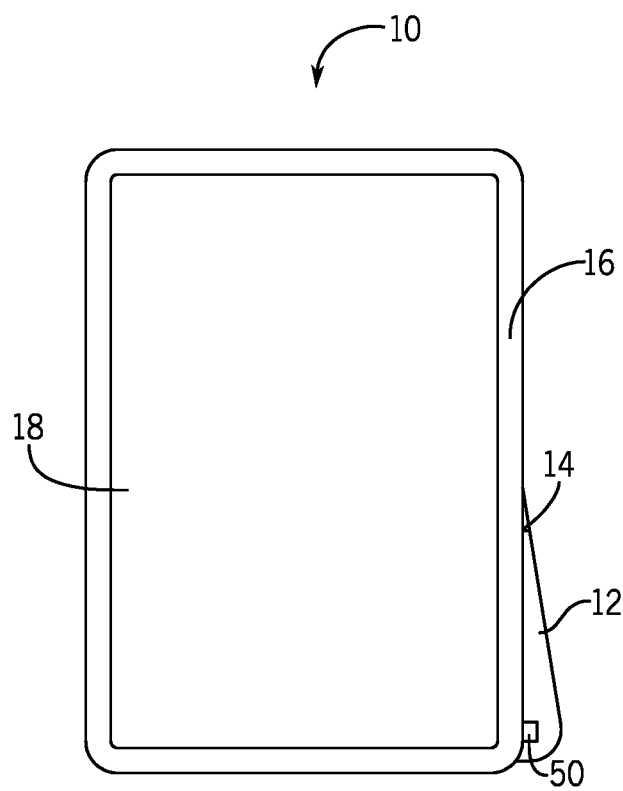
FIG. 1 is a front perspective diagram of an electronic device, according to embodiments of the present disclosure.

With the foregoing in mind, FIG. 1 is a front perspective diagram of an electronic device 10, according to embodiments of the present disclosure. The electronic device 10 may include, for example, a tablet, laptop, cellular phone, smartphone, phablet, wearable device, computing device, or any other suitable device that includes a hinged component 12 coupled to the electronic device 10 via a hinge 14. As illustrated, the electronic device 10 of FIG. 1 is a tablet, and the hinged component 12 is a kickstand that enables the electronic device 10 to maintain an upright or semi-upright position without user assistance. While the present disclosure refers to the hinged component 12 as being coupled to the electronic device 10 via the hinge 14, it should be understood that the hinged component 12 may also be considered as part of the electronic device 10, and, as such, reference to the electronic device 10 in the present disclosure may mean the remainder or main body 16 (e.g., a housing or a first housing portion) of the electronic device 10 minus the hinged component 12 (e.g., a second housing portion). As illustrated, the electronic device 10 includes two hinges 14, a first hinge disposed on a first (e.g., left) portion of the main body 16 and on a first (e.g., left) the hinged component 12, and a second hinge disposed on a second (e.g., right) portion of the main body 16 and on a second (e.g., right) portion the hinged component 12. While FIG. 1 illustrates the hinged component 12 coupled to the main body 16 via the two hinges 14, it should be understood that more or less hinges 14 are contemplated.

In some embodiments, the main body 16 of the electronic device 10 also includes an electronic display 18. The display 18 may employ any suitable technology to present visual information according to electrical input signals by emitting light or modulating available light. For example, the display 18 may be a liquid crystal display (LCD), a plasma display, a light emitting diode (LED) display, an organic LED (OLED) display, a microLED display, or an electromagnetic metasurface. The kickstand may be employed to orient the electronic device 10 in a standing or near-vertical position, as shown in FIG. 1, such that a user may view the display 18 without holding the electronic device 10 or manually maintaining the electronic device 10 in the standing or near-vertical position.

Figure 2:
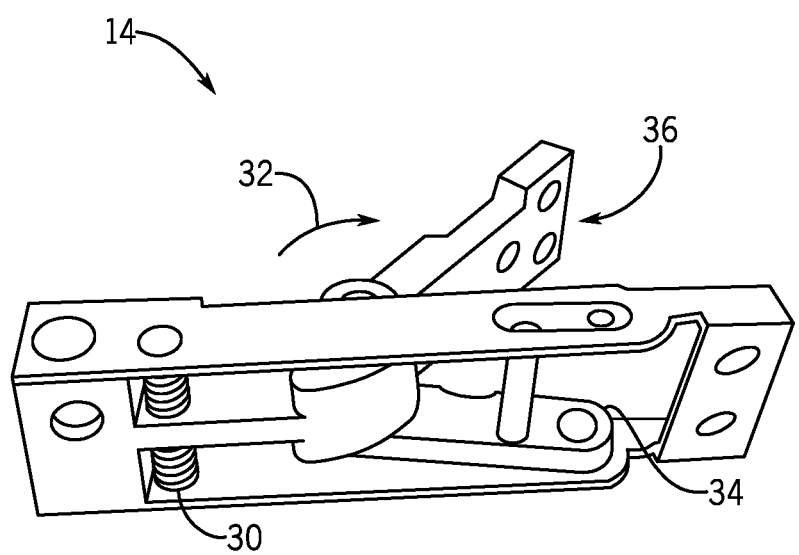
FIG. 2 is a hinge of the electronic device of FIG. 1 with a biasing element, according to embodiments of the present disclosure.

The hinge 14 may enable the hinged component 12 to pivot or rotate relative to the main body 16 of the electronic device 10 into open and closed positions. In some embodiments, the hinge 14 may include one or more biasing elements that provide torque to facilitate opening or closing the hinge 14. For example, FIG. 2 is a hinge 14 of the electronic device 10 of FIG. 1 with a biasing element 30, according to embodiments of the present disclosure. The biasing element 30 is illustrated as a torsion spring in FIG. 2, but may include any suitable element that may provide torque to open or close the hinge 14, such as a leaf spring, a compression spring, an extension spring, and the like. As illustrated, the biasing element 30 provides torque to open the hinge 14 (e.g., in the direction 32). In some embodiments, the hinge 14 may include a position stop 34 that stops the hinge 14 from opening further. The position stop 34 may enable the hinge 14 to open in one or more preset or preconfigured open positions. For example, as illustrated, the position stop 34 enables the hinge 14 to open to a preset open position 34. In additional or alternative embodiments, the position stop 34 may enable the hinge 14 to open to different or multiple preset open positions 34, or the hinge 14 may include multiple position stops 34 that enable the hinge 14 to open to different or multiple preset open positions 34. The one or more preset or preconfigured open positions of the hinge 14 may enable the hinged component 12 to open to a position that enables the electronic device 10 to maintain an upright or semi-upright position without user assistance.

Returning to FIG. 1, the main body 16 of the electronic device 10 also includes one or more electrical or electromagnetic windings or coils that are used to facilitate opening (e.g., moving away or increasing a separation distance of) the hinged component 12 from the main body 16. As illustrated, a magnet 50 in the hinged component 12 may be paired with a winding (not shown) disposed in the main body 16 of the electronic device 10 and positioned opposite of the magnet 50. That is, when the hinged component 12 is adjacent to the main body 16 (e.g., when the hinged component 12 is closed), the magnet 50 may line up with, be adjacent to, and/or be disposed opposite of the winding 62.

Figure 3:
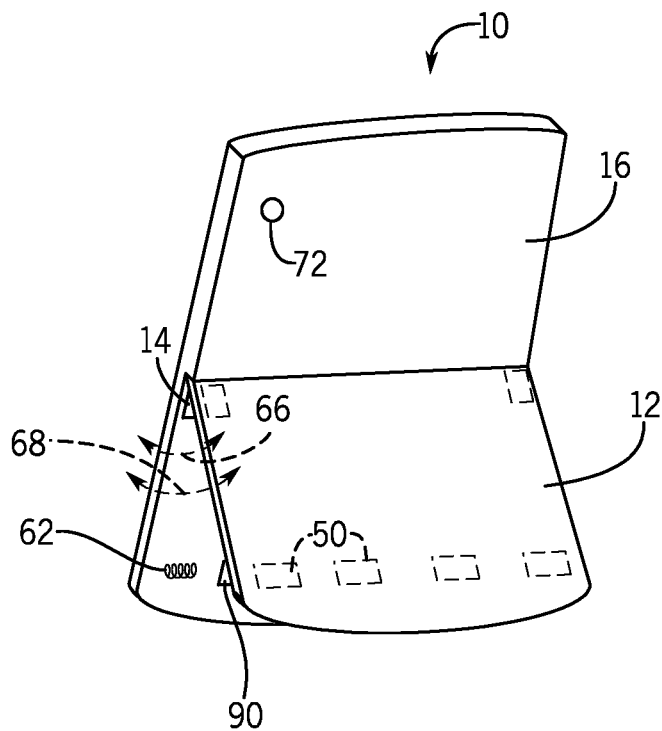
FIG. 3 is a rear perspective diagram of the electronic device of FIG. 1, according to embodiments of the present disclosure.

For example, FIG. 3 is a rear perspective diagram of the electronic device 10 of FIG. 1, according to embodiments of the present disclosure. FIG. 3 shows an electrical winding or coil 62, paired with the magnet 50. While FIG. 3 illustrates the winding 62 in the main body 16 of the electronic device 10 and the magnet 50 in the hinged component 12, it should be understood that, in some embodiments, the winding 62 may be disposed in the in the hinged component 12, while the magnet 50 may be disposed in the main body 16. Moreover, the windings 62 and the magnets 50 may be positioned in the electronic device 10 and the hinged component 12 such that electromagnetic fields emitted from the windings 62 and the magnets 50 may not effect operation of the electronic device 10. For example, the windings 62 and the magnets 50 may be positioned at or near an edge or periphery of the electronic device 10 and the hinged component 12 to increase distance from components of the electronic device 10 and/or the hinged component 12 that may be negatively affected by electromagnetic interference (such as a controller, processor, or display). Moreover, in some embodiments, electromagnetic shielding may be used to block at least a portion of the electromagnetic fields emitted from the windings 62 and the magnets 50 (e.g., in a direction towards the components of the electronic device 10 and/or the hinged component 12 that may be negatively affected by electromagnetic interference). The electromagnetic shielding may include any suitable material, such as conductive and/or magnetic materials that reduce incoming or outgoing emissions of electromagnetic frequencies.

Figure 4:
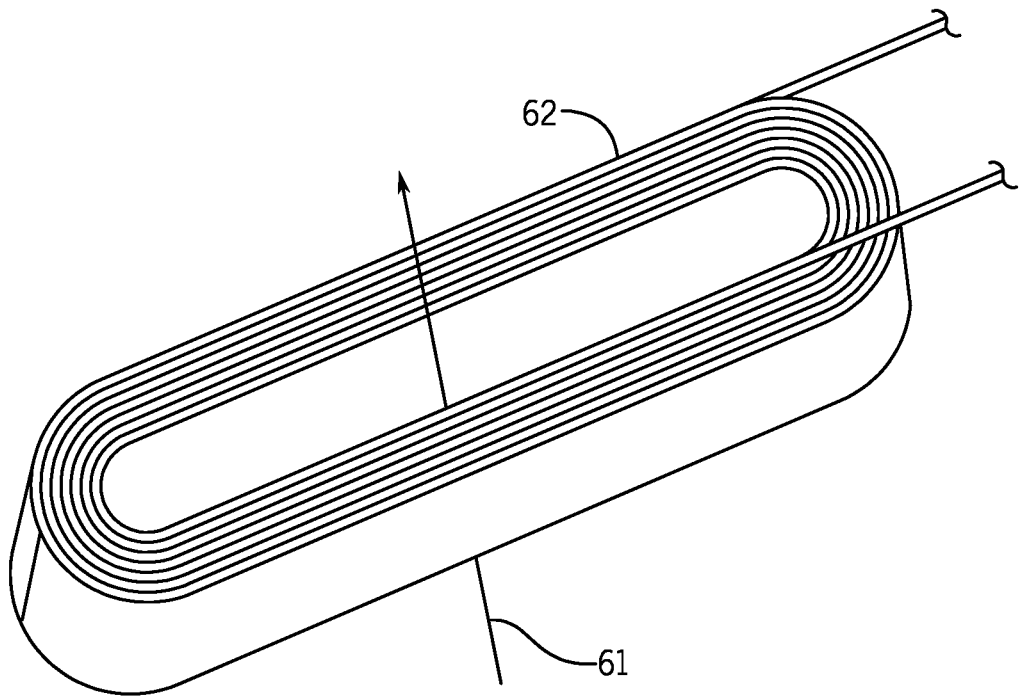
FIG. 4 is a perspective diagram of a winding of the electronic device of FIG. 1, according to embodiments of the present disclosure.

For example, FIG. 4 is a perspective diagram of a winding 62 of the electronic device 10 of FIG. 1, according to embodiments of the present disclosure. The winding 62 may be an electrical conductor, such as a wire. Applying current to the winding 62 may generate a magnetic field parallel to an axis 61 of the winding 62.

The main body 16 of the electronic device 10 may also include additional magnet 50 and winding 62 pairs. While FIG. 3 illustrates the magnets 50 in the hinged component 12 and the windings 62 in the main body 16 of the electronic device 10, it should be understood that these positions may be reversed. The magnets 50 may include permanent magnets. The winding 62 is coiled in a direction opposite of the North/South direction of the magnet's magnetic field, such that applying a current to the winding 62 may cause the winding 62 to generate a magnetic field that is similar in polarity to the magnet's magnetic field. As such, magnetic repulsion is generated between the winding 62 and the magnet 50, causing the hinged component 12 to separate from the rest of the electronic device 10, thereby opening the hinged component 12.

Figure 5:
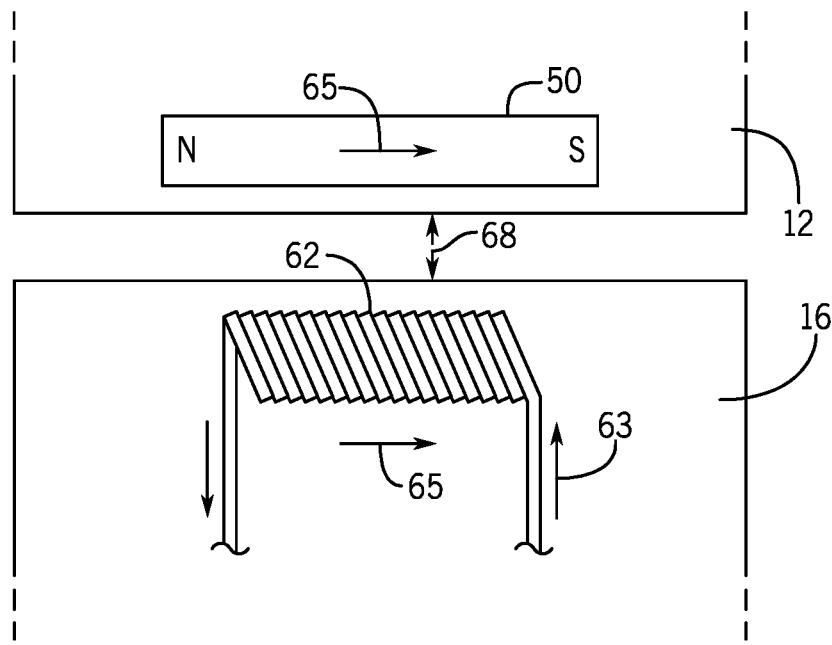
FIG. 5 is a perspective diagram of a winding of the electronic device of FIG. 1 and a magnet of the hinged component exhibiting magnetic repulsion when current is applied to the winding, according to embodiments of the present disclosure.

For example, FIG. 5 is a perspective diagram of a winding 62 of the electronic device 10 of FIG. 1 and a magnet 50 of the hinged component 12 exhibiting magnetic repulsion when current is applied to the winding 62, according to embodiments of the present disclosure. In particular, when a current (e.g., a current pulse) is applied to the winding 62 (in the direction 63), a magnetic field is generated in the winding 62 with polarity (from a North pole to a South pole) in the direction 65. Because the polarity of the magnet 50 (from a North pole to a South pole) is in the same direction 65, magnetic repulsion 68 may be generated between the winding 62 of the electronic device 10 and the magnet 50 of the hinged component 12, causing the hinged component 12 to separate from the electronic device 10 and open. Power usage in providing current to the one or more windings 62 illustrated in FIGS. 3-7 and 9-12 may be quantified in the range of approximately 0.01 to 1 milliWatts, 0.1 to 0.5 milliWatts, or 0.25 to 0.4 milliWatts. In some embodiments, the magnets 50 may instead also be electrical or electromagnetic windings (such as the windings 62, though coiled in an opposite direction from the windings 62 or having current applied in an opposite direction as that applied to the windings 62). As such, applying current to both sets of windings may generate magnetic repulsion between the sets of windings.

Figure 6:
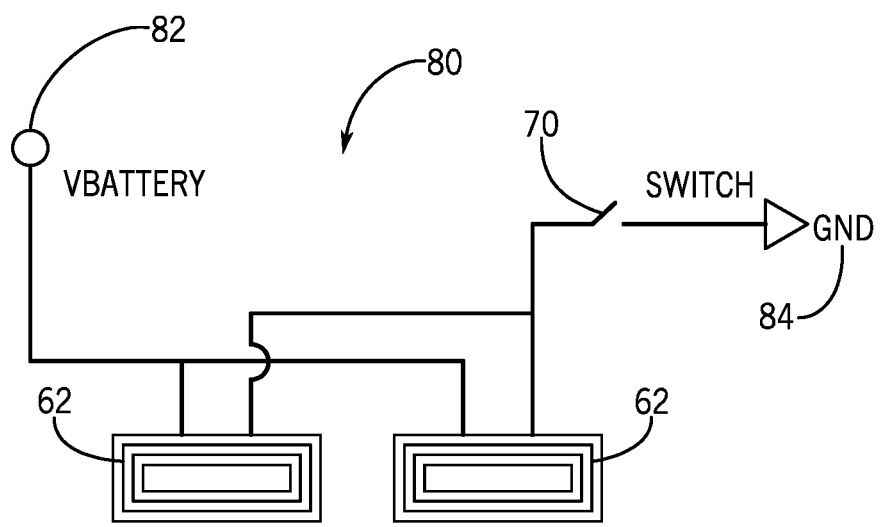
FIG. 6 is a circuit diagram of a circuit used to automatically open the hinged component of the electronic device of FIG. 1, according to embodiments of the present disclosure.

The current may be applied by a power source, such as a battery. The power source may be coupled (e.g., electrically coupled) to the winding 62 via a switch 70. The switch may be activated or deactivated using any suitable mechanism, such as a button 72 disposed on the main body 16 of the electronic device 10. For example, FIG. 6 is a circuit diagram of a circuit 80 used to automatically open the hinged component 12 of the electronic device 10 of FIG. 1, according to embodiments of the present disclosure. As illustrated, each winding 62 may be coupled to a power source 82 (e.g., a battery) and a ground 84, with a switch 70 that is configured to provide or disconnect current from the power source 82. Engaging the switch 70 may provide current from the power source 82 to the windings 62, generating a magnetic field. In some embodiments, the current may be applied in a reverse configuration, causing a magnetic field in the windings 62 that attracts the magnetic field of the windings, thus facilitating closing the hinged component 12.

Figure 7:
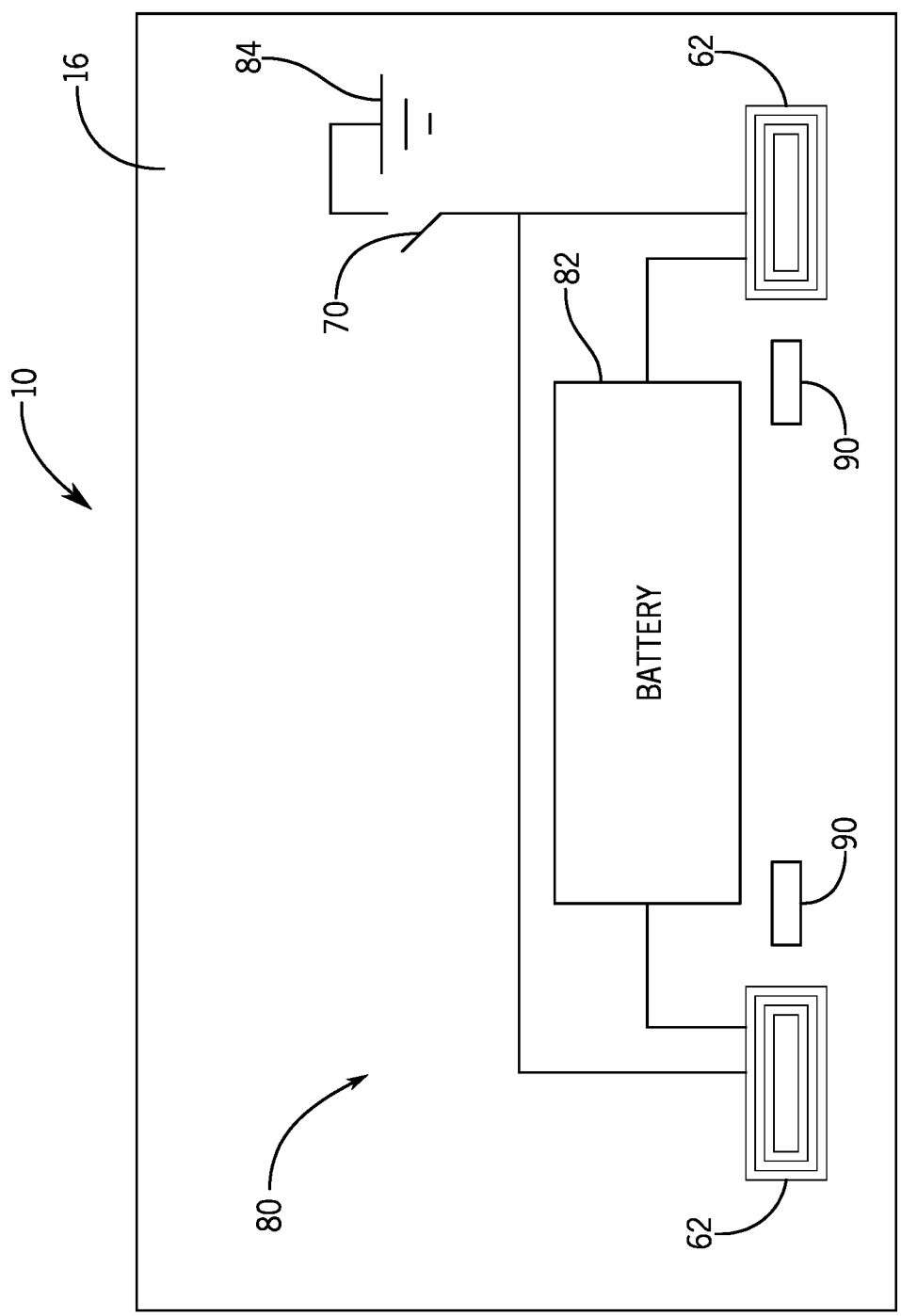
FIG. 7 is a schematic diagram of the circuit of FIG. 6 disposed in the electronic device of FIG. 1, according to embodiments of the present disclosure.

FIG. 7 is a schematic diagram of the circuit 80 of FIG. 6 disposed in the electronic device 10 of FIG. 1, according to embodiments of the present disclosure. FIG. 7 also includes additional magnets 90 in the main body 16 of the electronic device 10 that may be positioned opposite of opposite polarity magnets 100 (e.g., opposite in polarity to the polarity of the additional magnets 90 and shown in FIG. 10) in the hinged component 12. The additional magnets 90 may thus urge the hinged component 12 closed (e.g., to keep the hinged component 12 closed when not in use) due to magnetic attraction to the opposite polarity magnets 100. In embodiments where the hinge 14 is a torsion hinge, the magnetic attraction 102 (shown in FIG. 10) between the additional magnets 90 and the opposite polarity magnets 100 may be stronger than the torque 66 applied by the hinge 14 in the opposite direction, and thus urge the hinged component 12 toward the main body 16 of the electronic device 10.

As a result, to open the hinged component 12, the windings 62, the magnets 50, the additional magnets 90, and/or the opposite polarity magnets 100 may be selected or designed such that the strength of the magnetic repulsion 68 between the windings 62 (when current is applied to the windings 62) and the magnets 50 may be greater than the magnetic attraction between the additional magnets 90 and the opposite polarity magnets 100 in order to open the hinged component 12. In cases where the hinge 14 is a torsion hinge, the windings 62, the magnets 50, the additional magnets 90, the opposite polarity magnets 100 and/or the hinge 14 may be selected or designed such that the strength of the magnetic repulsion 68 between the windings 62 (when current is applied to the windings 62) and the magnets 50 and the strength of the torque 66 applied by the hinge 14 is greater than the magnetic attraction between the additional magnets 90 and the opposite polarity magnets 100 in order to open the hinged component 12.

Figure 8:
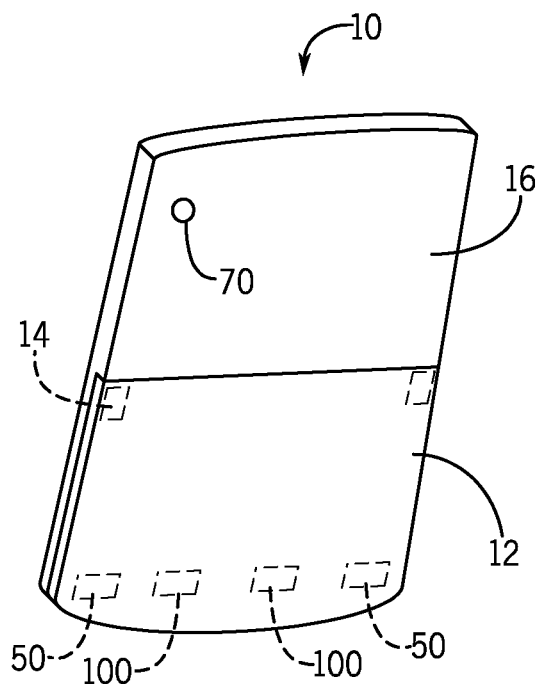
FIG. 8 is a rear perspective diagram of the electronic device of FIG. 1 illustrating opposite polarity magnets keeping the hinged component closed, according to embodiments of the present disclosure.

The magnetic attraction between the additional magnets 90 and the opposite polarity magnets 100 may keep the hinged component 12 closed without a mechanical locking mechanism. For example, FIG. 8 is a rear perspective diagram of the electronic device 10 of FIG. 1 illustrating the opposite polarity magnets 100 keeping the hinged component 12 closed (due to magnetic attraction to the additional magnets 90), according to embodiments of the present disclosure. Moreover, when closed (e.g., when positioned adjacent to the main body 16 of the electronic device 10), the hinged component 12 may form a flat (approximately uninterrupted) surface with the main body 16 of the electronic device 10. Thus, a user may open the hinged component 12 by applying a current to the windings 62, and thus without first manually unlocking a mechanical locking mechanism of the hinged component 12 before opening the hinged component 12. In some embodiments, the hinged component 12 and/or the main body 16 of the electronic device 10 may include an additional mechanical locking mechanism, such as a latch, in addition to the windings 62 and the magnets 50. In such cases, the user may selectively mechanically lock the hinged component 12 to the main body 16 if desired, but may also leave the hinged component 12 mechanically unlocked. Because the additional magnets 90 and the opposite polarity magnets 100 are magnetically attracted to each other when the user desires to close the hinged component 12, the hinged component 12 may stay in place whether or not the hinged component 12 is mechanically locked by a mechanical locking mechanism.

Figure 9:
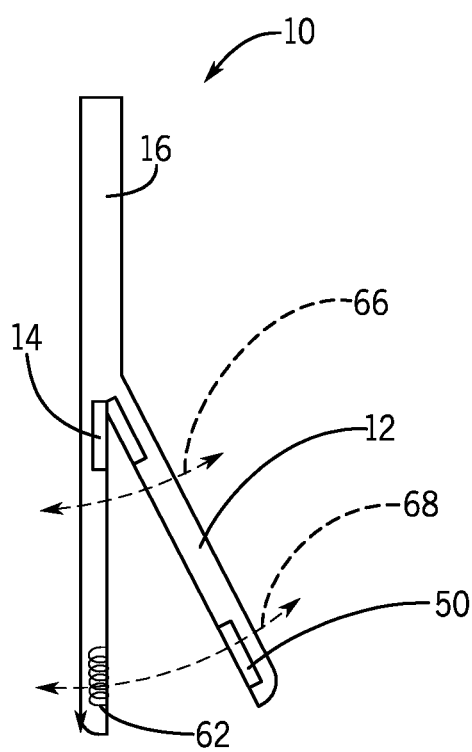
FIG. 9 is a side perspective diagram of the electronic device of FIG. 1, according to embodiments of the present disclosure.

FIG. 9 is a side perspective diagram of the electronic device 10 of FIG. 1, according to embodiments of the present disclosure. When current is applied to windings 62, the magnetic field generated by the windings 62 and the magnetic field of the magnets 50 exhibit magnetic repulsion 68. This magnetic repulsion 68 and the torque 66 applied by the hinge 14 may urge the hinged component 12 away from the main body 16 of the electronic device 10, opening the hinged component 12.

Figure 10:
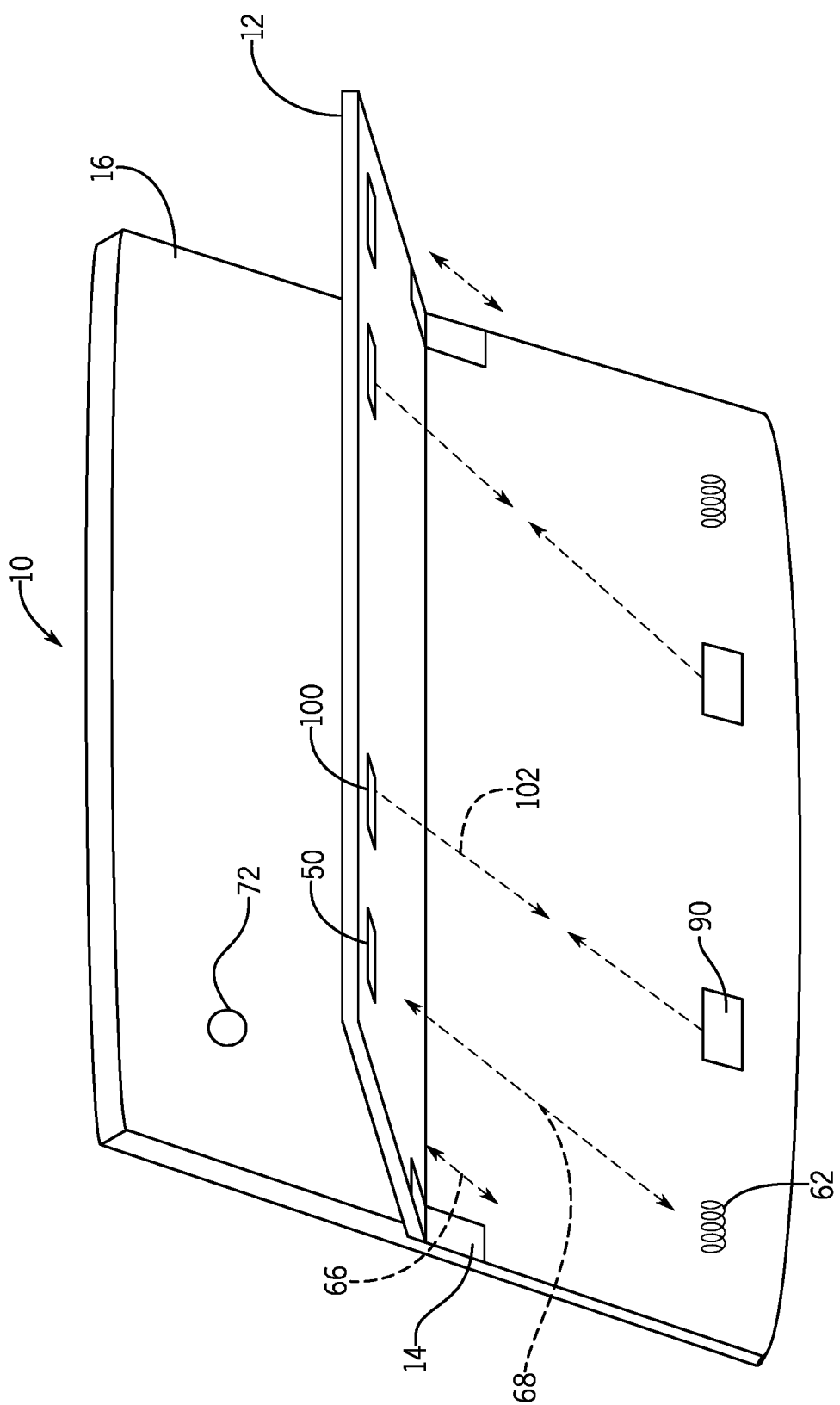
FIG. 10 is a rear perspective diagram of an example electronic device, according to embodiments of the present disclosure.

FIG. 10 is a rear perspective diagram of an example electronic device 10, according to embodiments of the present disclosure. In particular, the hinged component 12 is illustrated in a different configuration than the rear perspective diagram of FIG. 3. As illustrated, the main body 16 of the electronic device 10 also includes the additional magnets 90 and the opposite polarity magnets 100 disposed in the hinged component 12. In embodiments where the hinge 14 is a torsion hinge, the magnetic attraction 102 between the additional magnets 90 and the opposite polarity magnets 100 may be stronger than the torque 66 applied by the hinge 14 in the opposite direction, and thus urge the hinged component 12 toward the main body 16 of the electronic device 10. When current is applied to the windings 62, the magnetic field generated by the windings 62 and the magnetic field of the magnets 50 exhibit magnetic repulsion 68. This magnetic repulsion 68 and the torque 66 applied by the hinge 14 may be stronger than the magnetic attraction 102 between the additional magnets 90 and the opposite polarity magnets 100, and thus urge the hinged component 12 away from the main body 16 of the electronic device 10.

Figure 11:
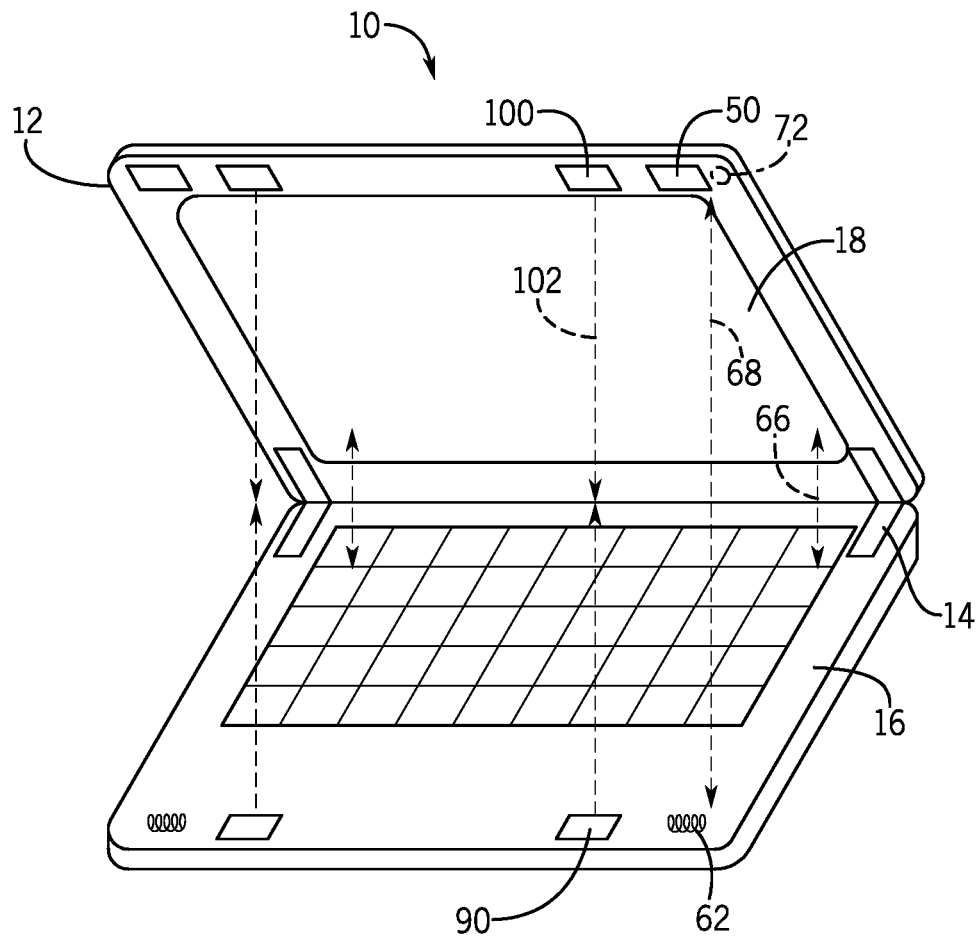
FIG. 11 is a front perspective diagram of an example electronic device, according to embodiments of the present disclosure.

FIG. 11 is a front perspective diagram of an example electronic device 10, according to embodiments of the present disclosure. As illustrated, the electronic device 10 of FIG. 11 may be a laptop, and the hinged component 12 may include a display 18 of the laptop. The button 72 that provides current to the winding 62 of may be located on the top surface of the hinged component 12. As illustrated, the main body 16 of the electronic device 10 also includes the additional magnets 90 and the opposite polarity magnets 100 disposed in the hinged component 12. When current is applied to the windings 62, the magnetic field generated by the windings 62 and the magnetic field of the magnets 50 exhibit magnetic repulsion 68. In embodiments where the hinge 14 is a torsion hinge, the magnetic repulsion 68 and the torque 66 applied by the hinge 14 may be stronger than the magnetic attraction 102 between the additional magnets 90 and the opposite polarity magnets 100, and thus urge the hinged component 12 away from the main body 16 of the electronic device 10.

As presently described, pressing the button 72 on the electronic device 10 directly closes the switch 70, completing the circuit 80 to provide power from the battery 82 to the windings 62 (e.g., as illustrated in FIG. 7). This configuration may result in power savings because the button 72 need not be monitored to determine whether it is pressed. However, in some embodiments, the electronic device 10 may include a sensor that detects when the button 72 is pressed, and a controller that activates the switch 70 based on the sensor detection. Moreover, rather than a physical switch, in some embodiments, the switch 70 may be implemented in software. For example, one or more signals may be sent to couple the windings 62 to the power source 82 in response to the sensor detecting that the button 72 has been pressed.

Figure 12:
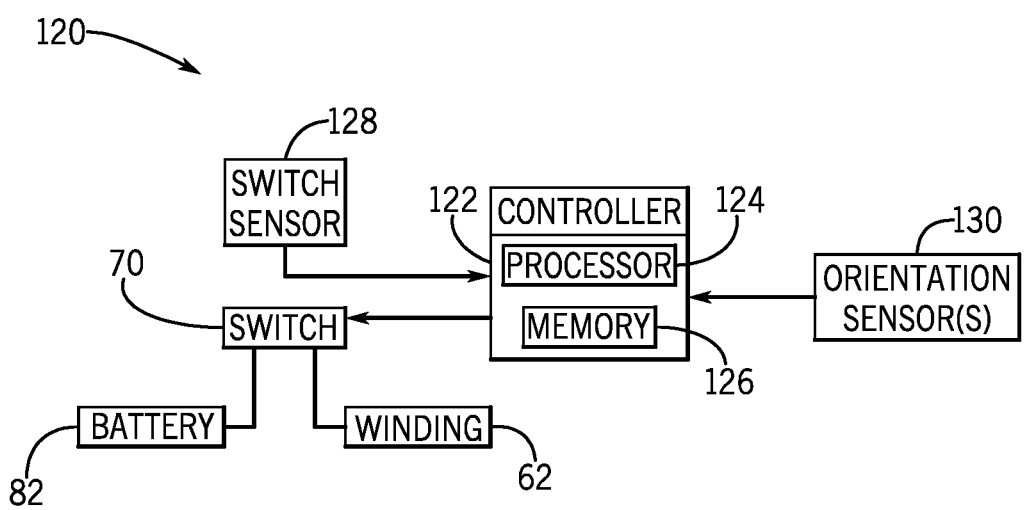
FIG. 12 is block diagram of an automatic hinged component opening system that may be incorporated in the electronic device of FIG. 1, according to embodiments of the present disclosure.

For example, FIG. 12 is block diagram of an automatic hinged component opening system 120 that may be incorporated in the electronic device 10 of FIG. 1, according to embodiments of the present disclosure. The system 120 may include a controller 122 that controls automatic opening the hinged component 12 by opening and closing the switch 70. The controller 122 may include one or more processors 124 (e.g., processing circuitry) and one or more memory devices 126 (which may include one or more storage devices). The processor 124 may execute software programs and/or instructions to facilitate automatically opening the hinged component 12. Moreover, the processor 124 may include multiple microprocessors, one or more "general-purpose" microprocessors, one or more special-purpose microprocessors, one or more application specific integrated circuits (ASICS), and/or one or more reduced instruction set (RISC) processors. The memory device 126 may store machine-readable and/or processor-executable instructions (e.g., firmware or software) for the processor 124 to execute, such as instructions relating to automatically opening the hinged component 12. As such, the memory device 126 may store, for example, control software, look up tables, configuration data, and so forth, to facilitate automatically opening the hinged component 12. In one embodiment, the processor 124 and the memory device 126 may be external to the controller 122. The memory device 126 may include a tangible, non-transitory, machine-readable-medium, such as a volatile memory (e.g., a random access memory (RAM)) and/or a nonvolatile memory (e.g., a read-only memory (ROM), flash memory, hard drive, and/or any other suitable optical, magnetic, or solid-state storage medium).

The system 120 may include a switch sensor 128 that detects whether the button 72 is pressed or not pressed. The switch sensor 128 may then send an indication (e.g., a signal) to the controller 122 that the button 72 is pressed (or not pressed). If the controller 122 receives an indication that the button 72 is pressed, then the controller 122 may send an instruction (e.g., a signal) to the switch 70 to close and couple (e.g., electrically couple) the battery 82 to the one or more windings 62. As such, the one or more windings 62 may generate one or more magnetic fields that repulse the magnetic fields of the magnets 50 of the hinged component 12, opening the hinged component 12. The controller 122 may then send an instruction to the switch 70 to open and decouple the battery 82 from the one or more windings 62 (e.g., based on the user no longer pressing the button 72). If the controller 122 receives an indication that the button 72 is not pressed (or does not receive an indication that the button 72 is pressed), then the controller 122 may not send an instruction (e.g., a signal) to the switch 70 to close, and the battery 82 and the one or more windings 62 may remain uncoupled.

In some embodiments, the controller 122 may activate or deactivate the switch 70 in response to receiving sensor data from a sensor, such as a touch sensor (e.g., a touchpad), a gesture sensor (e.g., a light sensor or camera), or an audio sensor (e.g., a microphone). For example, in response to a touch from the user on the touch sensor, a gesture detected by the gesture sensor (e.g., waving a hand over the electronic device 10), or a predetermined sound detected by the audio sensor (e.g., snapping fingers or a vocal command, such as "Open"), the controller 122 may activate or deactivate the switch 70. In some embodiments, the controller 122 may activate or deactivate the switch 70 based on user interaction with a virtual assistant. That is, a user may request that the virtual assistant open the hinged component 12, and, in response, the controller 122 may activate or deactivate the switch 70.

In some embodiments, the system 120 may include one or more orientation sensors 130 that provide an indication (e.g., one or more signals) of the orientation of the electronic device 10 to the controller 122. The orientation sensors 130 may include, for example, accelerometers, gyroscopes, magnetometers, and/or any other suitable sensor that facilitates detecting the orientation of the electronic device 10. The controller 122 may then send an instruction to the switch 70 to close and couple the battery 82 to the one or more windings 62 based on the indication. For example, if the electronic device 10 is a tablet and the hinged component 12 is a kickstand, the orientation sensors 130 provide an indication that a surface (e.g., a bottom surface) of the electronic device 10 is stationary or at a constant vertical position (e.g., resting on a table), the remainder of the electronic device 10 is changing position (e.g., being lifted up from an approximately horizontal or lying position), and the hinged component 12 (e.g., in the form of a kickstand) is closed, then this may indicate that a user is positioning the electronic device 10 for viewing on a fixed surface (e.g., the table), and the controller 122 may send an instruction to the switch 70 to close and couple the battery 82 to the one or more windings 62 to open the hinged component 12.

In cases where the controller 122 may reverse the current applied to the windings 62, if the same electronic device 10 is resting on the fixed surface and the hinged component 12 is open, and the orientation sensors 130 provide an indication that (each surface of) the electronic device 10 is moving (e.g., being lifted up), then this may indicate that a user is lifting the electronic device 10 from the fixed surface for use or storage, and the controller 122 may send an instruction to the switch 70 to close and couple the battery 82 to the one or more windings 62 to facilitate closing the hinged component 12.

In some cases, the controller 122 may open the hinged component 12 in an effort to protect the electronic device 10. For example, if the orientation sensors 130 provide an indication that the electronic device 10 is moving at a rate of speed consistent with falling (e.g., accelerating at 9.81 meters/second$^2$) and the hinged component 12 is closed, then the controller 122 may send an instruction to the switch 70 to close and couple the battery 82 to the one or more windings 62 to open the hinged component 12 in an effort to protect the electronic device 10.

In some embodiments, other sensor information provided by sensors of the electronic device 10 may be used by the controller 122 to determine when to automatically open the hinged component 12. For example, if the electronic device 10 is a laptop and the hinged component 12 includes the display 18, the orientation sensors 130 provide an indication that a surface (e.g., a bottom surface) of the electronic device 10 is stationary or at a constant vertical position (e.g., resting on a table), a light sensor indicates a threshold amount of light (e.g., indicative of the electronic device 10 not being stored in, for example, a bag or briefcase), and the hinged component 12 is closed, then this may indicate that a user is positioning the electronic device 10 for use on a fixed surface (e.g., the table), and the controller 122 may send an instruction to the switch 70 to close and couple the battery 82 to the one or more windings 62 to open the hinged component 12.

It should be understood that automatically opening (or closing) the hinged component 12 may be customized by a user. For example, the user may configure which stimuli (e.g., related to movement of the electronic device 10, ambient conditions, or the like) or levels of the stimuli used by the controller 122 to determine whether to open (or close) the hinged component 12.

Figure 13:
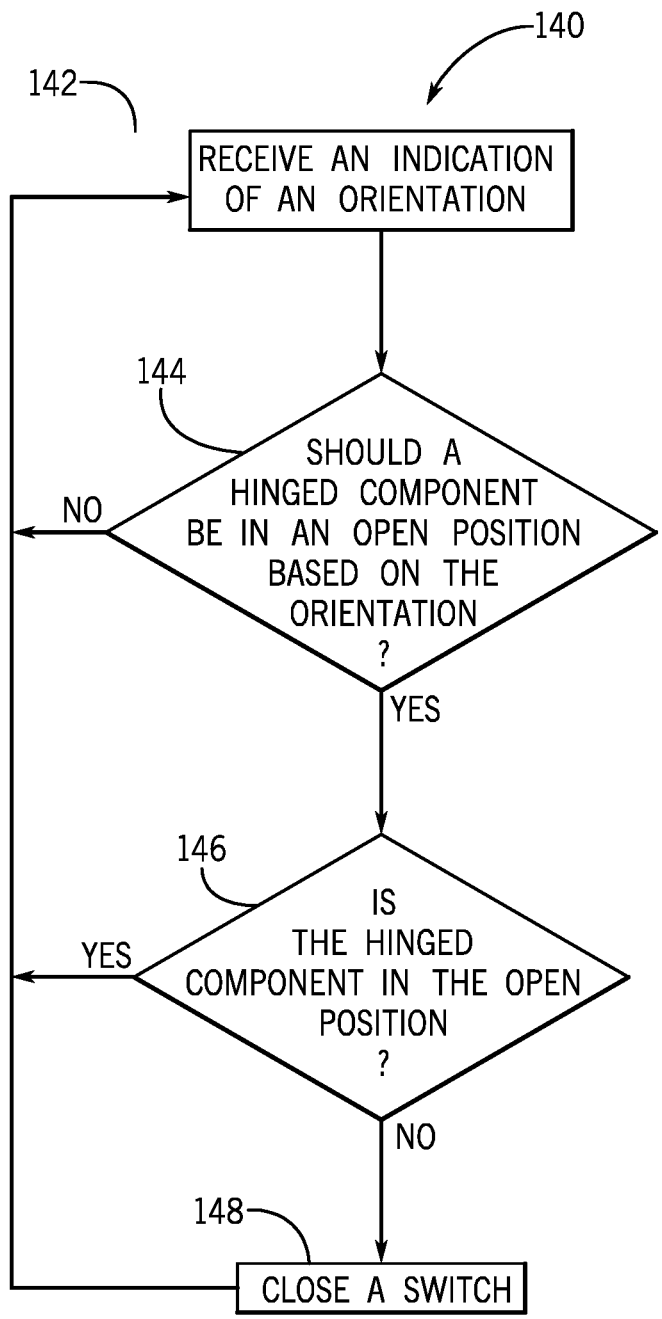
FIG. 13 is a flowchart illustrating a process for automatically opening or closing the hinged component of the electronic device of FIG. 1, according to embodiments of the present disclosure.

FIG. 13 is a flowchart illustrating a process 140 for automatically opening the hinged component 12 of the electronic device 10 of FIG. 1, according to embodiments of the present disclosure. While the process 140 is described as being performed by the processor 124, it should be understood that the process 140 may be performed by any suitable device that may control the hinged component 12 of the electronic device 10 of FIG. 1. Furthermore, while the process 140 is described using steps in a specific sequence, it should be understood that the present disclosure contemplates that the described steps may be performed in different sequences than the sequence illustrated, and certain described steps may be skipped or not performed altogether. In some embodiments, the process 140 may be implemented by executing instructions stored in a tangible, non-transitory, computer-readable medium, such as the memory device 126, using any suitable processing circuitry, such as the processor 124.

As illustrated, in process block 142, the processor 124 receives an indication of an orientation of the electronic device 10. In particular, the indication may be provided by one or more orientation sensors 130 of the electronic device 10, which may include accelerometers, gyroscopes, magnetometers, and/or any other suitable sensor that facilitates detecting the orientation of the electronic device 10.

In decision block 144, the processor 124 then determines whether the hinged component 12 should be in an open position based on the orientation of the electronic device 10. For example, if the electronic device 10 is a tablet and the hinged component 12 is a kickstand, and the orientation sensors 130 provide an indication that a surface (e.g., a bottom surface) of the electronic device 10 is stationary or at a constant vertical position (e.g., resting on a table) while the remainder of the electronic device 10 is changing position (e.g., being lifted up from an approximately horizontal or lying position), then the processor 124 may determine that the hinged component 12 should be in an open position as this may indicate that a user is positioning the electronic device 10 for viewing on a fixed surface (e.g., the table).

In some cases, the controller 122 may open the hinged component 12 in an effort to protect the electronic device 10. As such, if the orientation sensors 130 provide an indication that the electronic device 10 is moving at a rate of speed consistent with falling (e.g., accelerating at 9.81 meters/second$^2$), then the processor 124 may determine that the hinged component 12 should be in the open position in an effort to protect the electronic device 10. In some embodiments, other sensor information provided by sensors of the electronic device 10 may be used by the controller 122 to determine when to automatically open the hinged component 12. For example, if the electronic device 10 is a laptop and the hinged component 12 includes the display 18, the orientation sensors 130 provide an indication that a surface (e.g., a bottom surface) of the electronic device 10 is stationary or at a constant vertical position (e.g., resting on a table), and a light sensor indicates a threshold amount of light (e.g., indicative of the electronic device 10 not being stored in, for example, a bag or briefcase), then the processor 124 may determine that the hinged component 12 should be in the closed position as this may indicate that a user is positioning the electronic device 10 for use on a fixed surface (e.g., the table).

If the processor 124 then determines that the hinged component 12 should be in the open position, then, in decision block 146, the processor 124 determines whether the hinged component 12 is already in the open position. If not, in process block 148, the processor 124 sends an instruction to the switch 70 to close and couple the battery 82 to the one or more windings 62 to open the hinged component 12. If the processor 124 determines that the hinged component 12 is already in the open position, then the processor 124 returns to process block 142 and the process 140 repeats. Returning to decision block 144, if the processor 124 determines that the hinged component 12 should not be in the open position, then the processor 124 returns to process block 142 and the process 140 repeats. In this manner, the processor 124 may automatically open the hinged component 12 without user or manual interaction.

In cases where the controller 122 may reverse the current applied to the windings 62, the processor 124 may determine whether the hinged component 12 should be in the closed position. For example, if the electronic device 10 is a tablet and the hinged component 12 is a kickstand, and the electronic device 10 is resting on the fixed surface, and the orientation sensors 130 provide an indication that (each surface of) the electronic device 10 is moving (e.g., being lifted up), then the processor 124 may determine that the hinged component 12 should be in a closed position as this may indicate that a user is lifting the electronic device 10 from the fixed surface for use or storage. If the processor 124 determines that the hinged component 12 should be in the closed position, then the processor 124 may determine whether the hinged component 12 is already in the closed position. If not, the processor 124 may send an instruction to the switch 70 to reverse the current applied to the one or more windings and close and couple the battery 82 to the one or more windings 62 to facilitate closing the hinged component 12.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A computing device, comprising:
   a first housing portion comprising:
      a sensor configured to transmit sensor data associated with the computing device;
      a power source;
      an electromagnetic winding configured to be coupled to the power source, wherein the electromagnetic winding is configured to generate a first magnetic field when receiving power from the power source;
      a processor communicatively coupled to the sensor and the electromagnetic winding, the processor configured to receive the sensor data from the sensor and cause the electromagnetic winding to receive the power from the power source based on the sensor data; and
      a first magnet spaced apart from the electromagnetic winding that generates a second magnetic field;
   a second housing portion comprising:
      a second magnet disposed opposite of the electromagnetic winding that generates a third magnetic field, the third magnetic field causing magnetic repulsion with respect to the first magnetic field when the first housing portion is adjacent to the second housing portion; and
      a third magnet disposed opposite of the first magnet that generates a fourth magnetic field, the fourth magnetic field causing magnetic attraction with respect to the second magnetic field when the first housing portion is adjacent to the second housing portion; and
   a hinge joining the first housing portion to the second housing portion, wherein the hinge enables the second housing portion to rotate relative to the first housing portion and comprises a spring that provides a force to rotate the second housing away from the first housing portion, wherein the force in combination with the magnetic repulsion are greater than the magnetic attraction.

2. The computing device of claim 1, wherein the second housing portion comprises a fourth magnet that generates a fifth magnetic field, wherein the first housing portion comprises a fifth magnet disposed opposite of the fourth magnet that generates a sixth magnetic field, the fifth magnetic field causing an additional magnetic attraction with respect to the sixth magnetic field.

3. The computing device of claim 1, wherein the magnetic repulsion of the first magnetic field with respect to the third magnetic field causes the second housing portion to move away from the first housing portion.

4. The computing device of claim 1, wherein the second housing portion comprises a display.

5. The computing device of claim 1, comprising a second hinge, wherein the hinge is disposed on a left portion of the first housing portion and a left portion of the second housing portion, wherein the second hinge is disposed on a right portion of the first housing portion and a right portion of the second housing portion.

6. The computing device of claim 1, wherein the second housing portion forms a flat surface with the first housing portion when positioned adjacent to the first housing portion.

7. The computing device claim 1, wherein the first housing portion comprises a switch coupling the power source to the electromagnetic winding, wherein the first magnetic field is generated when the switch is closed.

8. The computing device of claim 7, wherein the switch is communicatively coupled to the processor, the processor being configured to receive the sensor data and cause the switch to close based on the sensor data.

9. The computing device of claim 7, wherein the sensor comprises a touch sensor, a gesture sensor, an orientation sensor, or any combination thereof.

10. The computing device of claim 1, wherein the second housing portion comprises a display, wherein the display is not visible when the second housing portion is adjacent to the first housing portion, wherein the rotation of the second housing portion away from the first housing portion is configured to cause the second housing portion to be in an open position that enables the display to be visible.

11. A computing device, comprising:
    a first housing comprising:
       a sensor configured to transmit sensor data associated with the computing device;
       a power source;
       an electromagnetic winding configured to generate a first magnetic field when coupled to the power source;

a processor communicatively coupled to the sensor and the electromagnetic winding, the processor configured to receive the sensor data from the sensor and cause the electromagnetic winding to couple to the power source based on the sensor data; and a first magnet physically separate from the electromagnetic winding that generates a second magnetic field;

a second housing comprising:

a second magnet opposite the electromagnetic winding that generates a third magnetic field, the third magnetic field causing magnetic repulsion with respect to the first magnetic field when the second housing is adjacent to the first housing; and a third magnet disposed opposite of the first magnet that generates a fourth magnetic field, the fourth magnetic field causing magnetic attraction with respect to the second magnetic field when the first housing is adjacent to the second housing; and a hinge joining the first housing to the second housing, wherein the hinge comprises a spring that provides a force to rotate the second housing away from the first housing, wherein the force in combination with the magnetic repulsion are greater than the magnetic attraction, and wherein the force without the magnetic repulsion is less than the magnetic attraction.

12. The computing device of claim 11, wherein the electromagnetic winding and the first magnet are disposed in the first housing and the second magnet and the third magnet are disposed in the second housing such that the first magnetic field, the second magnetic field, the third magnetic field, and the fourth magnetic field do not interfere with operation of the computing device.

13. The computing device of claim 11, wherein the first housing comprises a fourth magnet that generates a fifth magnetic field, wherein the second housing comprises a fifth magnet disposed opposite of the fourth magnet that generates a sixth magnetic field, wherein the fifth magnetic field causes an additional magnetic attraction with respect to the sixth magnetic field.

14. The computing device of claim 13, wherein strength of the magnetic repulsion between the first magnetic field and the third magnetic field is greater than strength of the magnetic attraction between the second magnetic field and the fourth magnetic field.

15. The computing device of claim 14, wherein the hinge comprises a torsion hinge, wherein the torsion hinge is configured to apply a torque on the second housing to urge the second housing away from the first housing.

16. The computing device of claim 15, wherein the strength of the magnetic repulsion between the first magnetic field and the third magnetic field and strength of the torque applied by the torsion hinge on the second housing to urge the second housing away from the first housing are greater than the strength of the magnetic attraction between the second magnetic field and the fourth magnetic field and strength of the additional magnetic attraction between the fifth magnetic field and the sixth magnetic field.

17. The computing device of claim 11, wherein the hinge enables the second housing to rotate away from the first housing to a position that enables the computing device to maintain an upright or semi-upright position.

18. A computing device, comprising:

a housing comprising:

a sensor configured to transmit sensor data associated with the computing device;

an electromagnetic winding configured to generate a first magnetic field when coupled to a power source;

a processor communicatively coupled to the sensor and coupled to the electromagnetic winding, the processor is configured to receive the sensor data from the sensor and cause the electromagnetic winding to couple to the power source based on the sensor data; and a first magnet spaced apart from the electromagnetic winding that generates a second magnetic field;

a kickstand comprising:

a second magnet opposite the electromagnetic winding that generates a third magnetic field, the third magnetic field causing magnetic repulsion force with respect to the first magnetic field when the kickstand is adjacent to the housing; and a third magnet dispose opposite of the first magnet that generates a fourth magnetic field, the fourth magnetic field causing magnetic attraction force with respect to the second magnetic field when the housing is adjacent to the kickstand; and a hinge joining the housing to the kickstand, wherein the hinge comprises a spring that provides a force to rotate the kickstand away from the housing, and wherein a first combination of the force and the magnetic attraction force without the magnetic repulsion force causes the kickstand to remain in a closed position such that the kickstand is adjacent to the housing;

and wherein when the force in combination with the magnetic repulsion force are greater than the magnetic attraction force, a second combination of the force, the magnetic repulsion force, and the magnetic attraction force causes the kickstand to rotate away from the housing to an open position that enables the computing device to maintain a near-vertical position.

19. The computing device claim 18, wherein the housing comprises a switch coupling the power source to the electromagnetic winding, wherein the first magnetic field is generated when the switch is closed.

20. The computing device of claim 19, wherein the housing comprises a button, wherein pressing the button closes the switch.

21. The computing device of claim 18, wherein the housing comprises a fourth magnet that generates a fifth magnetic field, wherein the kickstand comprises a fifth magnet disposed opposite of the fourth magnet that generates a sixth magnetic field, the fifth magnetic field causing an additional magnetic attraction force with respect to the sixth magnetic field.

22. The computing device of claim 21, wherein strength of the magnetic repulsion force between the first magnetic field and the third magnetic field and strength of the force applied by the hinge on the kickstand to urge the kickstand away from the housing are greater than strength of the magnetic attraction force between the second magnetic field and the fourth magnetic field and strength of the additional magnetic attraction force between the fifth magnetic field and the sixth magnetic field.

* * * * *